(12) United States Patent
Takeya et al.

(10) Patent No.: US 6,509,579 B2
(45) Date of Patent: Jan. 21, 2003

(54) SEMICONDUCTOR DEVICE

(75) Inventors: Motonobu Takeya, Miyagi; Katsunori Yanashima; Masao Ikeda, both of Kanagawa; Takeharu Asano, Miyagi; Shinro Ikeda, Miyagi; Tomonori Hino, Miyagi; Katsuyoshi Shibuya, Miyagi, all of (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/760,959

(22) Filed: Jan. 16, 2001

(65) Prior Publication Data
US 2001/0035534 A1 Nov. 1, 2001

(30) Foreign Application Priority Data
Jan. 13, 2000 (JP) ..................... P2000-010057

(51) Int. Cl.⁷ .............................. H01L 29/06
(52) U.S. Cl. .................. 257/22; 257/86; 257/103
(58) Field of Search .................. 257/86, 103, 190; 438/503

(56) References Cited

U.S. PATENT DOCUMENTS

| | | | | |
|---|---|---|---|---|
| 6,015,979 A | * | 1/2000 | Sugiura et al. | 257/86 |
| 6,051,849 A | * | 4/2000 | Davis et al. | 257/103 |
| 6,225,650 B1 | * | 5/2001 | Tadatomo et al. | 257/190 |
| 6,265,289 B1 | * | 6/2001 | Zheleva et al. | 438/503 |

FOREIGN PATENT DOCUMENTS

JP        10-256661        9/1998        ........... H01L/31/04

* cited by examiner

Primary Examiner—David Nelms
Assistant Examiner—Thinh Nguyen
(74) Attorney, Agent, or Firm—Sonnenschein, Nath & Rosenthal

(57) ABSTRACT

To provide a semiconductor device capable of preventing the bowing of the substrate, and having a semiconductor layer of a III-V group compound of a nitride system with excellent crystallinity.

The semiconductor layer of the III-V group compound of the nitride system whose thickness is equal to or less than 8 μm, is provided onto a substrate made of sapphire. This reduces the bowing of the substrate due to differences in a thermal expansion coefficient and a lattice constant between the substrate and the semiconductor layer of the III-V group compound of the nitride system. An n-side contact layer forming the semiconductor layer of the III-V group of the nitride system has partially a lateral growth region made by growing in a lateral direction from a crystalline part of a seed crystal layer. In the lateral growth region, dislocation density restricts low, therefore, regions corresponding to the lateral growth region of each layer formed onto the n-side contact layer has excellent crystallinity.

20 Claims, 10 Drawing Sheets

SEMICONDUCTOR DEVICE

RELATION APPLICATION DATA

The present application claims priority to Japanese Application No. P2000-010057 filed Jan. 13, 2000, which application is incorporated herein by reference to the extent permitted by law.

BACKGROUND OF THE INVENTION

1. Field of the Invention

The present invention relates to a semiconductor device including a semiconductor layer made of a semiconductor of a III-V group compound of a nitride system.

2. Description of the Related Art

The semiconductor of the III-V group compound of the nitride system such as a GaN mixed crystal, a AlGaN mixed crystal or a GaInN mixed crystal is a direct transition semiconductor material, and at the same time, has a characteristic in such that its forbidden band width spreads from 1.9 eV to 6.2 eV. For this reason, these semiconductors of the III-V group compound of the nitride system can obtain light emission from a visible range to an ultra violet range, therefore, it is noteworthy for a material making a semiconductor light-emitting device such as a semiconductor laser diode (LD) or a laser emitting diode (LED). In connection with this, the semiconductor of the III-V group compound of the nitride system is focused attention as a material making an electron device because of its fast saturation electron speed and its large break-down field.

In general, the semiconductor device using the semiconductor of the III-V group compound of the nitride system has a structure such that layers of the semiconductor of the III-V group compound of the nitride system grown with a MOCVD (Metal Organic Chemical Vapor Deposition) method and a MBE (Molecular Beam Epitaxy) method, are stacked sequentially. As for the substrate, generally, materials whose quality is different from that of the semiconductor of the III-V group compound of the nitride system are employed and a sapphire ($Al_2O_3$) substrate is mainly employed. Conventionally, in such a semiconductor device, a total thickness of the semiconductor of the III-V group compound of the nitride system becomes thicker to obtain the semiconductor of the III-V group compound of the nitride system with excellent crystallinity, which maintains and enhances electrical or optical device characteristics. The semiconductor of the III-V group compound of the nitride system with excellent crystallinity can be obtained by growing under high temperature (in case of GaN, the temperature is about 1000° C.).

However, sapphire and the semiconductor of the III-V group compound of the nitride system are different in a lattice constant and has a large difference in a thermal expansion coefficient. For this reason, when growing the semiconductor of the III-V group compound of the nitride system, bowing of the sapphire substrate is caused. The bowing of the sapphire substrate is like to be larger when growing the semiconductor of the III-V group compound of the nitride system thicker or when growing under high temperature. The bowing of the substrate causes fractures in the sapphire substrate and the bowing of the semiconductor layer of the III-V group compound of the nitride system, which fails in stability in a manufacturing process significantly. In addition, temperature of the substrate when growing the semiconductor of the III-V group compound of the nitride system becomes unstable, and then a composition of the semiconductor of the III-V group compound of the nitride system grown thereon becomes heterogeneous depending ranges, which consequently gives damage to controllability in a manufacturing process. Specifically, when growing the GaInN mixed crystal as an active layer of a light-emitting device using the semiconductor of the III-V group compound of the nitride system, a taken-in-amount of indium (In) changes. As a result of this, variation in an oscillation wavelength occurs so that a light-emitting effective area capable of oscillating a specific wavelength, becomes narrow.

Such problems can be solved by using a substrate made of the semiconductor of the III-V group compound of the nitride system such as GaN. However, for using this kind of the substrate, there are problems in that a manufacturing cost and a size of the substrate, then it has not been commercialized yet. Accordingly, in a recent situation, the bowing of the substrate is a problem to be solved urgently.

In recent years, as for growing a crystal of the semiconductor of the III-V group compound of the nitride system, several technique to reduce density of the penetration dislocation (a defect such that a dislocation defect is propagated and penetrated in crystals; See FIGS. 5 and 9) are suggested. One of the techniques is to form an opening such that a trench in a seed crystal of the semiconductor of the III-V group compound of the nitride system formed on the substrate, and then a crystal is grown in a lateral direction from a side wall surface corresponding to the opening of the seed crystal. As for other techniques, there is a technique such that a belt-shaped mask is formed onto the semiconductor layer of the III-V group compound of the nitride system which becomes an underlying layer, and the semiconductor of the III-V group compound of the nitride system is selectively grown in a lateral direction thereon. With such techniques, it is desired that the semiconductor of the III-V group compound of the nitride system with excellent crystallinity is grown and device characteristics are enhanced. However, even if with these techniques, the above-mentioned bowing of the substrate is caused. Accordingly, reduction of the bowing of the substrate is urgent necessity for enhancing productivity and device characteristics.

Other and further objects, features and advantages of the invention will appear more fully from the following description.

SUMMARY OF THE INVENTION

The invention has been achieved in consideration of the above problems and its object is to provide a semiconductor device capable of preventing bowing the substrate and having a semiconductor layer of a III-V group compound of a nitride system with excellent crystallinity.

A semiconductor device according to the present invention comprises a semiconductor layer made of a semiconductor of a III-V group compound of a nitride system containing at least one kind element among a III group element and at least nitride among a V group element on one side of the substrate, and the semiconductor layer partly has a lateral growth region made by growing the semiconductor of a III-V group compound of a nitride system in a lateral direction, then a thickness of the semiconductor layer is equal to or less than 8 μm.

In a semiconductor device according to the present invention, the semiconductor layer having a lateral growth region is equal to or less than 8 μm, so that the semiconductor is excellent in crystallinity and at the same time, bowing of the substrate can be restricted.

BRIEF DESCRIPTION OF THE DRAWINGS

These and other objects and features of the present invention will become clear from the following description of the preferred embodiments given with reference to the accompanying drawings, in which.

DETAILED DESCRIPTION OF THE PREFERRED EMBODIMENT

Hereinafter, embodiments of the present invention will be described by referring drawings in detail.

Figure 1:
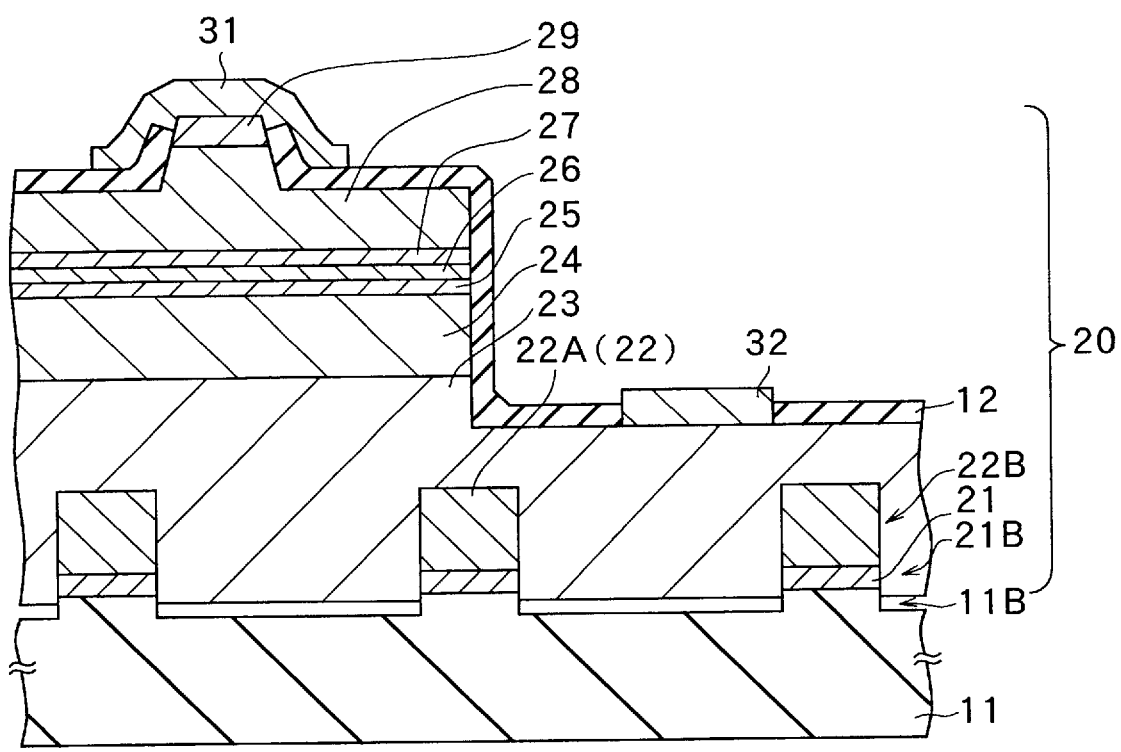
FIG. 1 is a section view showing a configuration of a main part of a semiconductor laser diode relative to a first embodiment of the present invention.

FIG. 1 is a view showing a configuration of a main part of a semiconductor laser diode as a semiconductor device relative to a first embodiment of the present invention. This semiconductor laser diode has a structure on a substrate 11 such that a seed crystal layer 22, a n-side contact layer 23, a n-side clad layer 24, a n-side guide layer 25, an active layer 26, a p-type guide layer 27, a p-type clad layer 28 and a p-side contact layer 29 are stacked as a semiconductor layer of a III-V group compound of the nitride system 20 (herein after it is referred to as a semiconductor layer 20) in this order with a buffer layer, which is a part of the semiconductor layer 20, in between. Here, the semiconductor of the III-V group compound of the nitride system contains at least, one kind element among a III group element such as gallium (Ga), aluminum (Al), boron (B) or indium (In) and at least nitride (N) among a V group element.

A p-side electrode 31 is formed onto the p-side contact layer 29. The n-side contact layer 23 partially has regions where the n-type clad layer 24, the n-type guide layer 25, the active layer 26, the p-type guide layer 27, the p-type clad layer 28 and the p-side contact layer 29 are not formed thereon. An insulating layer 12 is provided with sides of the above-mentioned layers and surfaces of the p-type clad layer 24 and the n-side contact layer 23. An n-side electrode 32 is provided onto the n-side contact layer 23 with an opening 12a provided in the insulating layer 12 in between.

The substrate 11 is made of a material whose thermal expansion coefficient is different from that of the semiconductor layer 20, for example, 80-$\mu$m-thickness sapphire. The buffer layer 21 and the like are formed onto a c face of the substrate 11. A concave part 11B is provided in a region corresponding to an opening part 22B of the seed crystal layer 22, which will be described later. A preferable depth of the concave part 11B is equal to or more than 100 nm.

A total thickness of layers forming the semiconductor layer 20 is equal to or less than 8 $\mu$m, because such layers can reduce the bowing of the substrate 11 caused by differences in the thermal expansion coefficient or in a lattice constant between the substrate 11 and the semiconductor layer 20. More preferably, the total thickness of the semiconductor layer 20 is within a range between equal to or more than 4 $\mu$m and equal to or less than 8 $\mu$m. As for the reason of such thickness, if thickness is less than 4 $\mu$m, element characteristics are degraded by poor crystallinity.

Specifically, the buffer layer 21 is within a range of 0.01 $\mu$m to 0.05 $\mu$m in a stacked direction (hereinafter it is referred to as a thickness), and is made of undope-GaN. This buffer layer 21 is made of a crystal similar to amorphous, and is a core when growing the semiconductor layer 20. Additionally, the buffer layer 21 has an aperture part 21B, which is provided in stripes with a predetermined interval of about from few $\mu$m to 10-odd $\mu$m. That is, in this case, a crystal of undope-GaN is also provided in stripes with a predetermined interval in between.

The seed crystal layer 22 is stacked onto the buffer layer 21, and has a crystalline part 22A made of a crystal of the semiconductor of the III-V group compound of the nitride system and an opening part 22B corresponding to a concave part 11B of the buffer layer 21. A crystal of undope-GaN whose thickness is within a range of 0.5 $\mu$m to 4.0 $\mu$m or a crystal of n-type GaN doped silicon (Si) as n-type impurity may be a specific example of the crystalline part 22A. Here, the seed crystal layer 22 corresponds to one specific example of a first crystalline layer of the invention. The opening part 22B corresponds to one specific example of a trench part of the invention.

The n-side contact layer 23 is made of n-type GaN doped silicon as n-type impurity and partially has a lateral growth region by growing in a lateral direction from the crystalline part 22A of the seed crystal layer 22. A preferable thickness of the n-side contact layer 23 is equal to or less than 6.0 $\mu$m, because such thickness reduces the bowing of the substrate 11, much more, thermal distribution of the substrate 11 can be more stable when stacking each of layers forming the semiconductor layer 20. Here, the n-side contact layer 23 corresponds to a specific example of a second crystalline layer of the present invention.

The n-type clad layer 24 is, for example, within a range of 0.7 $\mu$m to 1.2 $\mu$m and is made of an n-type AlGaN mixed crystal (for instance, $Al_{0.08}Ga_{0.92}N$) doped silicon as n-type impurity. The n-type guide layer 25 is, for example, within a range of 0.08 μm to 0.12 μm and is made of n-type GaN doped silicon as n-type impurity. The active layer 26 is, for example, within a rage of 0.02 μm to 0.04 μm and has a multiple quantum well structure. This structure comprises a well layer and a barrier layer formed by a GaInN mixed crystal layer having different composition respectively. respectively.

The p-type guide layer 27, is for example, within a range of 0.08 μm to 0.12 μm and is made of p-type GaN doped magnesium (Mg) as p-type impurity. The p-type clad layer 28 is, for example, within a range of 0.3 μm to 0.7 μm and is made of a p-type AlGaN mixed crystal doped magnesium as p-type impurity. The p-side contact layer 29 is, for example, within a range of 0.05 μm to 0.1 μm and is made of p-type GaN doped magnesium as p-type impurity. Here, for electric current restriction, a part of the p-side contact layer 29 and the p-type clad layer 28 is formed in a narrow belt shape (so-called laser stripe; in FIG. 1, a belt shape extends in a vertical direction relative to a paper of FIG. 1). This laser stripe is provided in a range of the opening part 22B of the seed crystal layer 22 thereon, for example.

The p-side electrode 31 is sequentially stacked palladium (Pd), platinum (Pt) and gold (Au) from a side of the p-side contact layer 29 and is electrically connected to the p-side contact layer 29. On the other hand, the n-side electrode 32 is sequentially stacked titanium (Ti), aluminum (Al), platinum (Pt), and gold (Au) and is electrically connected to the n-side contact layer 23.

In this semiconductor laser diode, for instance, a pair of sides vertical to a longitudinal direction of the p-side electrode 31 is an end surface of a resonator. A pair of reflective mirrors (unillustrated) is respectively formed in the pair of an end surface of a resonator.

Next, a method of manufacturing the semiconductor laser diode will be explained.

Figure 2A:
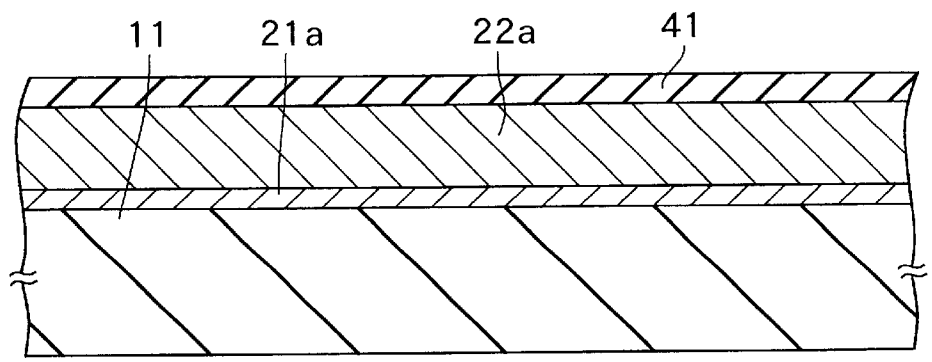
FIG. 2A is a section view for describing a method of manufacturing the semiconductor laser diode shown in FIG. 1.

In the present embodiment, as shown in FIG. 2A, the substrate 11 whose thickness is about 430 μm and made of sapphire, is prepared. With the MOCVD method, the semiconductor layer 20 is grown onto the c face of the substrate 11 in order to become a thickness equal to or less than 8 μm. Specifically, the semiconductor layer 20 is grown as described hereinafter.

First, a growth layer 21a is grown in a range of 0.01 μm to 0.05 μm in order to form the buffer layer 21. In this case, a temperature of the substrate 11 is set, for example, at 520° C. Then, the temperature is elevated at 1000° C. and undope-GaN or n-type GaN doped silicon is grown in a range of 0.5 μm to 4.0 μm onto the growth layer 21a for a buffer layer 21 so as to form a growth layer 22a in order to form a seed crystal layer 22. After this, for instance, with a CVD (Chemical Vapor Deposition) method, the insulating film 41 made of silicon nitride or silicon dioxide is formed on the growth layer 22a for a seed crystal layer 22. The growth layer 22a for a seed crystal layer 23 can be formed in each of atmospheres: an atmospheric atmosphere, a low-pressure atmosphere, a high-pressure atmosphere. However, among these atmospheres, for obtaining a crystal with high quality, the high-pressure atmosphere is preferable.

Figure 2B:
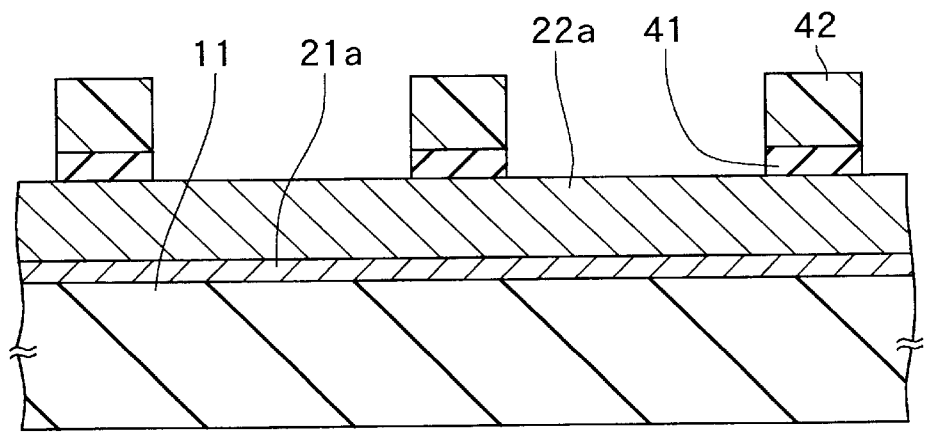
FIG. 2B is a section view for describing a method of manufacturing the semiconductor laser diode following to FIG. 2A.

Following this, as shown in FIG. 2B, a photoresist film 42 is formed onto a insulating film 41 and a plurality of striped patterns arranged with a predetermined interval is formed in <1–100> directions of a GaN crystal (the growth layer 22a for the seed crystal layer 22). Then, for example, RIE is carried out with this photoresist film 42 as a mask in order to remove the insulating film 41 selectively. The photoresist film 42 is removed after removing the insulting film 41 selectively. Here, <1–100> represents by adding "-" in front of numerals for convenience in writing, although it generally is represented by drawing a line over numerals.

Figure 2C:
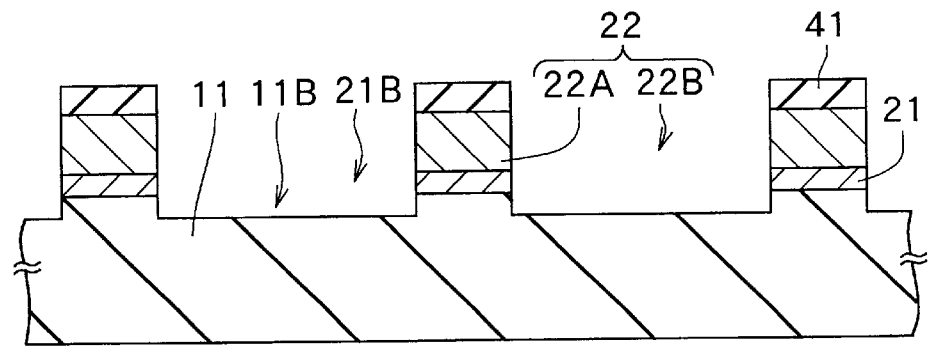
FIG. 2C is a section view for describing a method of manufacturing the semiconductor laser diode following to FIG. 2B.

After removing the photoresist film 42, as shown in FIG. 2C, RIE is carried out with the insulating film 41 as a mask in order to remove parts, which the growth layer 22a, the growth layer 21a and the substrate 11 are uncovered with the insulating film 41 to expose the substrate 11 in turn. This etching the growth layer 22a into the seed crystal layer 22 having the crystalline part 22A and the opening part 22B, and turns the growth layer 21a for a buffer layer into the buffer layer 21 having the aperture part 21B. Additionally, the concave part 11B is formed in the substrate 11.

Figure 3:
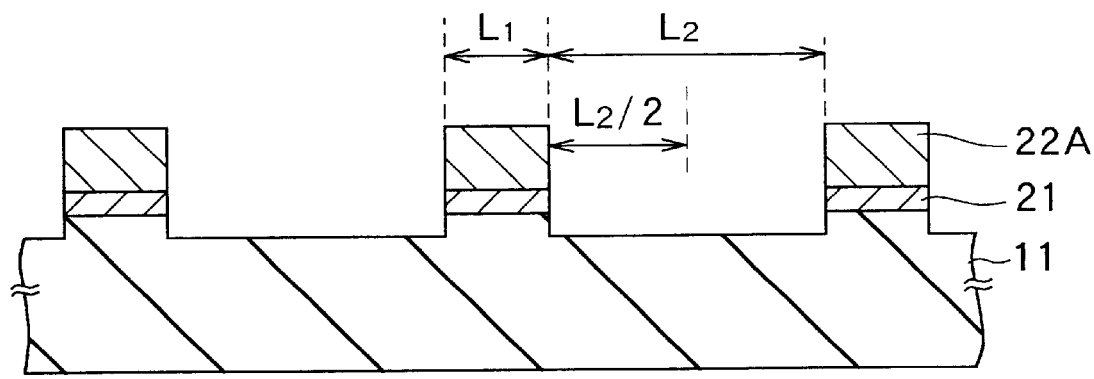
FIG. 3 is a section view for describing an advantage of appropriately choosing a width of a crystalline part and an opening part of the semiconductor laser diode shown in FIG. 1.

As shown in FIG. 3, RIE is carried out in a preferable manner that a length $L_1$ in a width direction of the crystalline part 22A of the seed crystal layer 22 (hereinafter it is referred to as a width) is less than 4 μm, and a width $L_2$ of the opening part 22B is equal to or less than 12 μm. Additionally, the width $L_1$ of the crystalline part 22A is preferably within a range of 2 μm to 4 μm and the width $L_2$ of the opening part 22B is within a range of 8 μm to 12 μm. The range of 8 μm–12 μm includes 12 μm. Specifically, the seed crystal layer 12 is formed in a manner that the width $L_1$ is 3 μm and the width $L_2$ is 9 μm.

In determining the width of $L_2$ of the opening part 22B being equal to or less than 12 μm, if the width $L_2$ is more than 12 μm, each of the crystals grown in a lateral direction from a side wall surface of the crystalline part 22A meets, which causes problems such that a growth surface of the n-side contact layer 23 takes time to be flatten or a flat growth surface can not be obtained. Additionally, for the reason of determining the width $L_2$ of the opening part 22B is more than 8 μm, the so-called laser stripe whose thickness is a range of 2 μm to 3 μm can be formed easily in a part of half of the width $L_2$ of the opening part 22B (a part of the width $L_2/2$ in FIG. 3).

On the other hand, determining the width of the crystal part 22A is less than 4 μm, if the width is more than 4 μm, a contact area of the seed crystal layer 22 and the substrate 11 becomes larger, which leads the bowing of the substrate 11 caused by differences in the thermal expansion coefficient and the lattice constant between materials contained in the substrate such as sapphire and the semiconductor of the III-V group compound of the nitride system. If the width of the crystalline part 22A is less than 2 μm, the width is too narrow, which causes difficulties at production.

Figure 4:
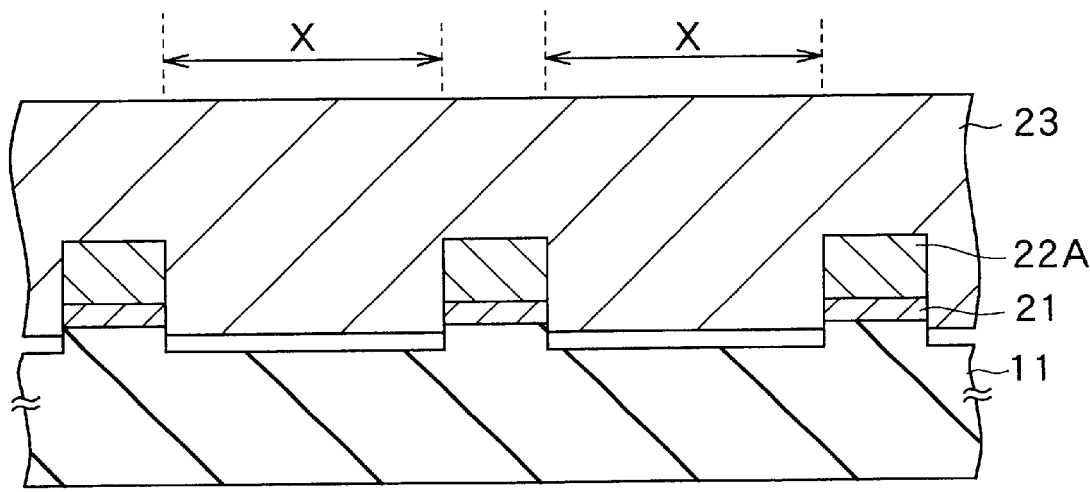
FIG. 4 is a section view for describing manufacturing processes following to FIG. 2C.
Figure 5:
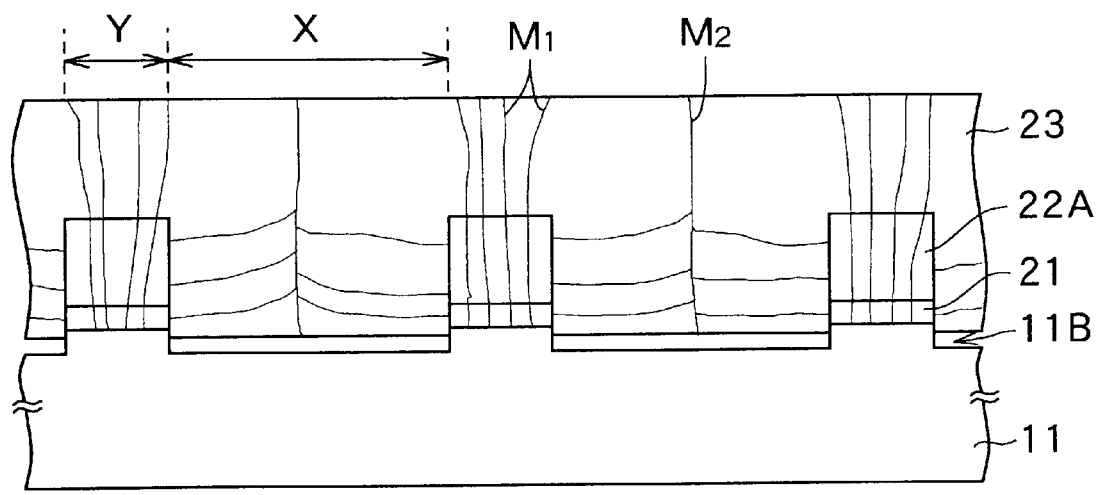
FIG. 5 is a diagram showing a part of the semiconductor laser diode shown in FIG. 1.

After exposing the substrate 11 selectively, as shown in FIG. 4, the insulating 41 is removed by etching. Then, silicon is doped as n-type impurity from the crystalline part 22A of the seed crystal layer 22 to grow n-type GaN, which forms the n-side contact layer 23. Here, crystal growth of GaN mainly progresses from a top surface and a side wall surface of the crystalline part 22A, and in case of regions except over the crystalline part 22A, it progresses in a lateral direction (a lateral growth region X). In addition, the crystal growth also progresses in a lateral direction from a side wall surface of the buffer layer 21. As shown in FIG. 5, this propagates penetration dislocation Ml from the seed crystal layer 22 (the crystalline part 22A) in a region Y over the crystalline part 22A of the n-side contact layer 23. However, in regions except the region Y (that is, the lateral growth region X), the penetration dislocation $M_1$ hardly exists because it bends in a lateral direction. Growth speed from a side of the crystalline part 22A is faster than that from a surface of the crystalline part 22A. After a lapse of specific time, a crystal of GaN grown from the side of the crystalline part 22A spreads over and the growth surface is flattened. The penetration dislocation $M_2$ shown in FIG. 5 is generated such that each of crystals is grown from the crystalline part 22A and meets in a lateral direction.

As described above, in case that the crystal growth progresses in a lateral direction from the seed crystal layer 22 and the buffer layer 21, it may slightly progress in a direction of a side of the substrate 11, not to the just right. However, in the present embodiment, a part of the substrate 11 is etched to provide the concave part 11B, which can prevent a defect caused by contact of grown crystals to the substrate 11. In addition, a crystal with less crystal disorientation, can be grown.

As has been described, crystals obtained by the above-mentioned method can gain a high quality compared with crystals obtained by other chemical vapor deposition methods. Hence, in the present embodiment, even if a thickness of the semiconductor layer 20 becomes thinner, each of layers except the buffer layer 21 comprising the semiconductor layer 20 is excellent in crystallinity.

Figure 6:
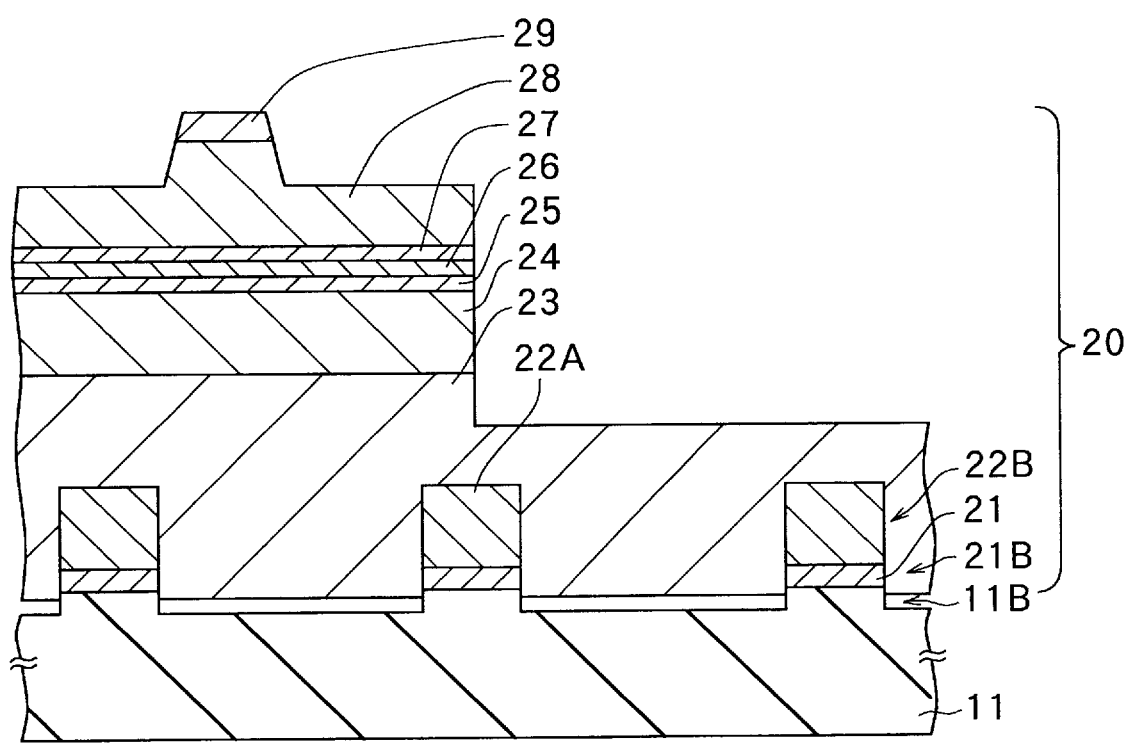
FIG. 6 is a section view for describing manufacturing processes following to FIG. 4.

After forming the n-side contact layer 23, as shown in FIG. 6, on the n-side contact layer 23, with the MOCVD method, for example, the n-type clad layer 24 is grown in a range of 0.7 $\mu$m to 1.2 $\mu$m, the n-type guide layer 25 is grown in a range of 0.08 $\mu$m to 0.12 $\mu$m, and then the active layer 26 is grown in a range of 0.02 $\mu$m to 0.04 $\mu$m, further, the p-type guide layer is grown in a range of 0.08 $\mu$m to 0.12 $\mu$m, the p-type clad layer 28 is grown in a range of 0.3 $\mu$m to 0.7 $\mu$m, and finally, the p-side contact layer 29 is grown in a range of 0.05 m to 0.1 $\mu$m. When each of layers is grown, a temperature of the substrate 11 is adjusted suitably at about 750° C.-1100° C. respectively.

A total thickness of the buffer layer 21, the n-side contact layer 23, the n-type clad layer 24 and the n-type guide layer 25 is so thin that the bowing of the substrate 11 is restricted when the n-type guide layer 25 is formed. Accordingly, when forming the active layer 26 made of a GaInN mixed crystal thereon, the temperature of the substrate 11 keeps stable, thus, a fixed amount of indium is taken in. Therefore, compositions of each of well layers in the active layer 26 and compositions of each of barrier layers are homogeneous without change in every region.

Additionally, the penetration dislocation $M_1$ is like to be propagated slightly spreading in a radiant way in a growth direction of the semiconductor layer 20. In the present embodiment, the total thickness of the semiconductor layer 20 is equal to or less than 8 $\mu$m so that the spread of the above-mentioned penetration dislocation $M_1$ can be smaller than conventional one.

When the MOCVD method is carried out, the gases described later are employed respectively. Trimethylgallium ($(CH_3)_3Ga$) is employed as source gas for gallium. Trimethylaluminum ($(CH_3)_3Al$) is employed as source gas for alminum. Trimethylindium ($(CH_3)_3In$) is employed as source gas for indium. Ammonia ($NH_3$) is employed as source gas for nitride. In addition, monosilane ($SiH_4$) is employed as source gas for silicon. Bis=cycropentadienyl magnesium ($(C_5H_5)_2Mg$) is employed as source gas for magnesium.

After growing the semiconductor layer 20, a part of the p-side contact layer 29, the p-type clad layer 28, the p-type guide layer 27, the active layer 26, the n-type guide layer 25, the n-type clad layer 24 and the n-side contact layer 23 is etched in turn to expose the n-side contact layer 23 on a surface. Following this, an unillustrated mask is formed to be used for selectively etching a part of the p-side contact layer 29 and the p-type clad layer 28 with RIE (a Reactive Ion Etching method), and an upper part of the p-type clad layer 28 and the p-side contact layer 29 become a narrow belt shape (a ridge shape).

In this case, the unillustrated mask is preferably disposed in a region corresponding to the width $L_2/2$ shown in FIG. 3. Since penetration dislocation $M_2$ is generated by meeting each of crystals grown in a lateral direction from the crystalline part 12 and exists in the general center of the width of the opening part 22B and, so-called laser stripe which becomes a radiative range, is formed from a part of a boundary surface of the opening part 12A and the crystalline part 22A to half of the width $L_2$ of the opening part 12B.

Figure 7:
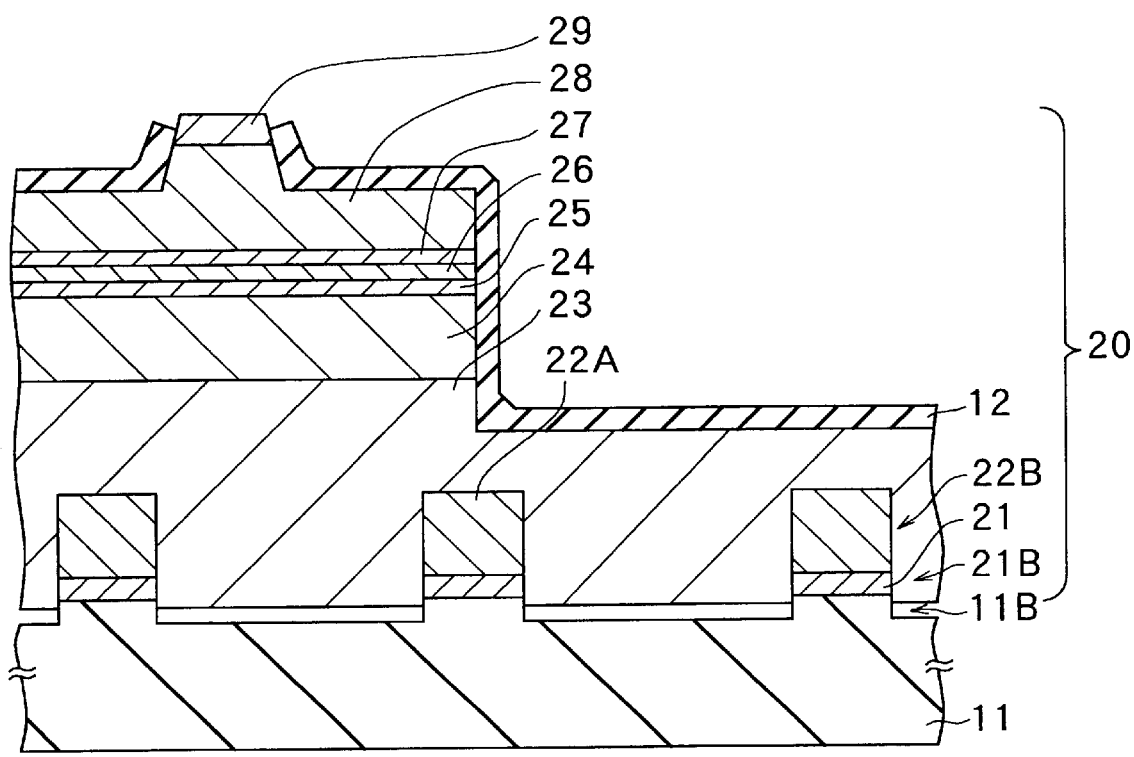
FIG. 7 is a section view for describing manufacturing processes following to FIG. 6.

After this, as shown in FIG. 7, the insulating layer 12 made of silicon dioxide ($SiO_2$) is formed with a deposition method in a whole exposed surface. Then, an unillustrated resist film is formed thereon. With RIE, the insulating layer 12 is exposed by selectively removing a region corresponding to the above-mentioned ridge shape in the resist film. Following this, by removing the exposed surface of the insulating film 12, the p-side contact layer 29 is exposed on a surface to cover regions except the surface of the p-side contact layer 29 with the insulating layer 12.

The p-side electrode 31 is formed by depositing palladium, platinum, and gold in turn on a surface and in a vicinity of the p-side contact layer 29. After forming the opening 12a in a region on the n-side contact layer of the insulating layer 12, the n-side electrode 32 is formed by depositing titanium, aluminum, platinum and gold in turn to the opening 12a. Then, the substrate 11 is ground in a manner to be 80 $\mu$m of thickness, for example. Here, the bowing of the substrate 11 is restricted so that it is ground easily. Finally, the substrate 11 is cleaved in a predetermined width perpendicular to a longitudinal direction of the p-side electrode 31, and on a cleavage surface, the unillustrated reflective mirrors are formed.

In the semiconductor laser diode, after a predetermined voltage is applied to the p-side electrode 31 and the n-side electrode 32, the current is applied to the active layer 26, which generates radiation caused by an electron-hole combination. A composition of a GaInN mixed crystal of each well layer and each barrier layer forming the active layer 26 are so homogenous that an oscillation wavelength is uniform.

As described above, in the semiconductor laser diode relative to the present embodiment, the semiconductor layer 20 whose total thickness is equal to or less than 8 $\mu$m is provided, which achieves restriction of the bowing of the substrate 11 caused by differences in the thermal expansion coefficient or the lattice constant between the substrate 11 and the semiconductor layer 20. Additionally, the bowing of the semiconductor layer 20 accompanying by the bowing of the substrate 11 can also be restricted. Consequently, before and after manufacturing, this prevents fractures of the substrate 11 and the semiconductor layer 20.

Further, accompanying by reduction of the bowing of the substrate 11, when growing the semiconductor layer 20, the temperature of the substrate 11 becomes stable. Therefore, especially, when forming the active layer 26 made of a GaInN mixed crystal, the fixed amount of indium taken in, thereby each of well layers and barrier layers comprising the active layer 26 become homogeneous in composition.

Hence, when activating, an oscillation wavelength becomes uniform, which attains a semiconductor laser diode with high repeatability. In addition, a position of forming a radiative range is not limited and flexibility in production can be attained, which contributes to productivity.

Furthermore, the n-side contact layer 23 is formed by using the crystalline part 22A and has the lateral growth region X so that the n-side contact layer 23, the n-type clad layer 24, the n-type guide layer 25, the active layer 26, the p-type guide layer 27, the p-type clad layer 28 and the p-side contact layer 29, those layer are formed on the n-side contact layer 23, have high crystallinity in the lateral growth region X. For the reason of this, if so-called laser stripe is formed in the lateral growth region X (specifically, a region corresponding to half of the width $L_2$ of the opening part 22B), degradation caused by applying a voltage is hardly occurred, thereby, the semiconductor laser diode with long life can be obtained.

When manufacturing, a crystal of the semiconductor of the III-V group compound of the nitride system whose thickness is equal to or less than 8 μm, is grown from the crystalline part 22A of the seed crystal layer 22 having the opening part 22B. Therefore, in the lateral growth region X, a high quality crystal in which the penetration dislocation $M_1$ hardly exist, is grown, and even if the penetration dislocation $M_1$ slightly spreads in a crystal growth direction, since a thickness of a grown crystal is not thick enough, the penetration dislocation $M_1$ affects less. This increases an excellent region in crystallinity with low-density of the penetration dislocation $M_1$, and in a latter process, a region capable of forming a radiative range increases. Flexibility in production can be enhanced, and the semiconductor laser diode with high quality and excellent repeatability can be obtained easily.

In connection with this, the bowing of the substrate 11 is restricted, which reduces a burden to the semiconductor layer 20 and as a result of this, manufacturing yields can be enhanced.

The semiconductor laser diode is utilized as a semiconductor light-emitting apparatus by mounting on a heat sink through a submount. The heat sink is for dissipating heat generated by the semiconductor laser diode. In the semiconductor laser diode of the present embodiment, as described above, the bowing of the submount 11 and accompanying by this, the bowing of the semiconductor layer 20 are reduced. As a result of this, the contact among the submount, the heat sink and the semiconductor laser diode increases, then the heat generated by the semiconductor laser diode when actuating can be dissipated well. This can prevent an increase in threshold current of the semiconductor laser diode and a decrease in a radiative output due to thermal interference. As a result of this, high quality can be maintained for a long time and the long-life semiconductor laser diode can be achieved.

Second Embodiment

Figure 8:
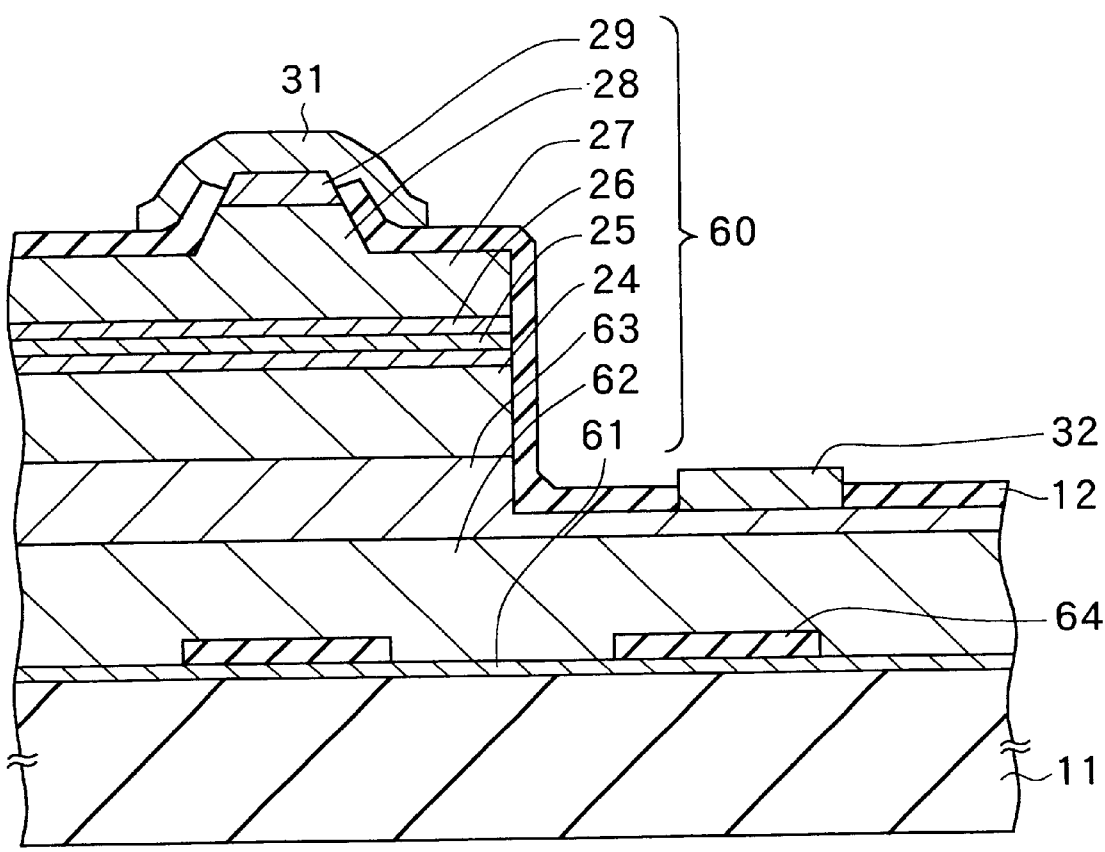
FIG. 8 is a section view showing a configuration of a main part of a semiconductor laser diode relative to a second embodiment.

FIG. 8 is a view showing a configuration of a main part of a semiconductor laser diode as a semiconductor device relative to a second embodiment of the present invention. The semiconductor laser diode has the same configuration, work and effect as the semiconductor laser diode except in that a semiconductor layer of a III-V group compound of a nitride system 60 (herein after it is referred to as a semiconductor layer 60) is included in replace of the semiconductor layer 20 relative to the first embodiment and further a mask part 64 is also included. Therefore, the same configurations has the same references and the detailed explanation is omitted.

The semiconductor layer 60 has an underlying layer 61, a covered growth layer 62 and an n-side contact layer 63 in place of the buffer layer 21, the seed crystal layer 22 and the n-side contact layer 23 of the semiconductor layer 20 respectively. The total thickness of the semiconductor layer 60 is equal to or less than 8 μm and a range of equal to or more than 4 μm to equal to or less than 8 μm is preferable as the same as the first embodiment.

The underlying layer 61 is provided adjacent to the substrate 11 within a range of 0.5 μm to 2.0 μm and made of a crystal of undope-GaN.

The mask part 64 is provided onto the underlying layer 61 with 0.1 μm of thickness and made of dielectrics such as silicon nitride ($Si_3N_4$) or silicon dioxide. The mask part 64 is a plurality of masks disposed in a predetermined interval. The plurality of masks is extended in a belt shape vertical to a sheet in FIG. 9 with an opening in between. On the mask part 64, the covered growth layer 62 is selectively grown in a lateral direction (a direction vertical to a stacking direction), which shields propagation of the penetration dislocation $M_1$ (See FIG. 8) from the underlying layer 61.

The covered growth layer 62 is within a range of 0.5 μm to 2.0 μm and made of undope-GaN. The covered growth layer 62 selectively has the lateral growth region X (See FIG. 9) grown in a lateral direction using the mask part 64. The n-side contact layer 63 is within a range of 2.0 μm to 5.0 μm and made of n-type GaN doped silicon as n-type impurity.

Next, a method of manufacturing of the semiconductor laser diode will be described hereinafter.

Figure 9:
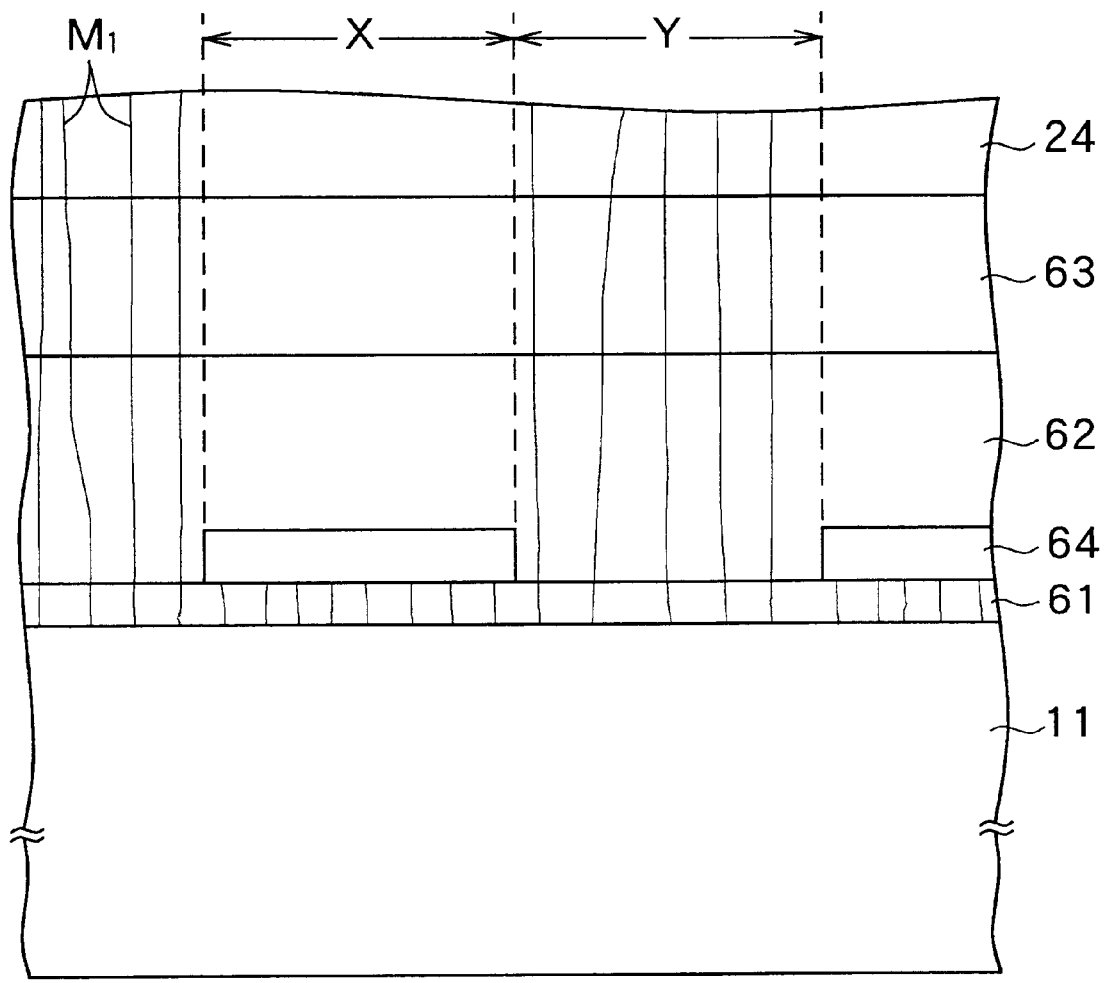
FIG. 9 is a diagram showing a part of the semiconductor laser diode shown in FIG. 8.

First, the substrate 11 made of sapphire is prepared. With the MOCVD method, the buffer layer 21 made of undope-GaN and the underlying layer 61 are grown in turn. In the underlying layer 61, the penetration dislocation $M_1$ illustrated with a thin line as shown in FIG. 9, typically exists. FIG. 9 is a view showing a part of processes in a method of manufacturing the semiconductor laser diode.

Following this, with a CVD (Chemical Vapor Deposition) method, a silicon dioxide layer is formed onto the underlying layer 61. Then, an unillustrated resist film is covered on the silicon dioxide layer to form a plurality of parallel belt-shaped resist patterns with photolithography. By using this, the silicon dioxide layer is selectively removed with etching to form the mask part 64.

With the MOCVD method, the covered growth layer 62 made of undope-GaN is grown in the same manner as the underlying layer 61. At this moment, firstly, GaN is grown in a manner to fill openings in each mask of the mask part 64 and is grown in a lateral direction on the mask. Accordingly, as shown in FIG. 9, in the region Y where the mask on the underlying layer 61 is not formed among the covered growth layer 62, the penetration $M_1$ is generated as the same as the underlying layer 61 because the penetration dislocation $M_1$ is propagated from the underlying growth layer 61. On the other hand, in the region X on the mask part within the covered growth layer 62, the penetration dislocation $M_1$ is generated because it is grown in a lateral direction.

After growing the covered growth layer 62, for example, with the MOCVD method, the n-side contact layer 63 is formed thereon. Processes after this are the same as the first embodiment. In the n-side contact layer 63, the n-type clad layer 24, the n-type guide layer 25, the active layer 26, the p-type guide layer 27, the p-type clad layer 28 and the p-side contact layer 29, the penetration dislocation M1 is not propagated in a part corresponding to the lateral growth region X (FIG. 9). Therefore, when the upper part of the p-type clad layer 28 and the p-side contact layer 29 are shaped in a ridge shape, if those layers are etched in a manner to leave the region Y (FIG. 9) on the mask part 64 where the penetration dislocation $M_1$ is not propagated, device characteristics of semiconductor laser diode such as life characteristics can be enhanced since a low-density region of the penetration dislocation $M_1$ (that is, a region with excellent crystallinity) become a radiative range on the above-mentioned layers.

As described above, in the semiconductor laser diode relative to the present embodiment, the semiconductor layer 60 whose total thickness is equal to or less than 8 μm, is provided on the substrate 11 so that the bowing the substrate 11 can be restricted as the same as the first embodiment.

Additionally, in a region on the mask part 64 formed on the underlying layer 61, the covered growth layer 62 is disposed. In the covered growth layer 62, propagation of the penetration dislocation $M_1$ is effectively prevented from the underlying layer 61 with a lateral growth, so that a semiconductor of a III-V group compound of a nitride system with excellent crystallinity is formed on the region (the lateral growth region X) where the propagation of the penetration dislocation $M_1$ is effectively prevented. Hence, device characteristics of the semiconductor laser diode can be improved by disposing a radiative range in a part corresponding to the lateral growth region X.

EXAMPLE

Further, specific examples of the present invention will be described in detail.

Examples 1–5; Evaluation of the GaN Layer

First, a substrate made of sapphire was prepared. GaN was grown on a c face of the substrate 40 nm with a MOCVD method to form a growth layer for a buffer layer. Following this, with the same MOCVD method, GaN was grown 2 μm to form a growth layer for a seed crystal layer, and then, a insulating film made of silicon nitride was formed on the growth layer for a seed crystal layer with a CVD method.

Next, a photoresist film was formed on the insulating film and at the same time, a plurality of patterns with a striped shape was formed. RIE was carried out with the pattern-formed photoresist film as a mask to remove the insulating film selectively. After this, the photoresist film was removed.

After removing the photoresist film, RIE was carried out with the insulating film as a mask to remove part, which the growth layer for the seed crystal layer, the growth layer for a buffer layer, and the substrate were uncovered with the insulating film in turn. Then, the substrate was exposed to an interface between the substrate and the growth layer for a buffer layer. This formed a seed crystal layer having a crystalline part and an opening part, and a buffer layer having an aperture part.

Following this, the insulating film was removed by etching. With the MOCVD method, a GaN layer was formed by growing GaN from the crystalline part of the seed crystal layer. At this moment, in Examples 1–5, a thickness of the GaN layer was changed as shown in Table 1. In addition, GaN grown from the crystalline part of the seed crystal layer had a region grown in a lateral direction selectively.

TABLE 1

| | Thickness of GaN (μm) | Half-Value Breadth (arcsec) |
|---|---|---|
| Example 1 | 4.0 | 158 |
| Example 2 | 5.0 | 124 |
| Example 3 | 5.0 | 131 |
| Example 4 | 7.0 | 121 |
| Example 5 | 8.0 | 139 |
| Comparative Example 1 | 10.0 | 194 |

When forming each of layers with the MOCVD method, trimethylgallium was employed as a source gas of gallium and ammonia was employed as a source gas of nitride.

As Comparative example 1 relative to Examples 1–5, the GaN layer was grown in a similar manner as Example 1–5 except in that a thickness of the GaN layer was 10 μm. As Comparative examples 2–5 relative to Examples 1–5, the GaN layer was grown as described hereinafter.

The substrate made of sapphire was prepared. GaN was grown 40 nm on the c face of the substrate with the MOCVD method to form the buffer layer. After this, on the buffer layer, GaN was grown with the MOCVD method to form the GaN layer. In this case, a thickness of the GaN layer was changed as shown in Comparative examples 2–5. The GaN layer was grown in a vertical direction relative to a growth surface substantially.

TABLE 2

| | Thickness of GaN (μm) | Half-Value Breadth (arcsec) |
|---|---|---|
| Comparative Example 2 | 3.9 | 222 |
| Comparative Example 3 | 4.0 | 215 |
| Comparative Example 4 | 4.0 | 227 |
| Comparative Example 5 | 5.0 | 198 |

Figure 10:
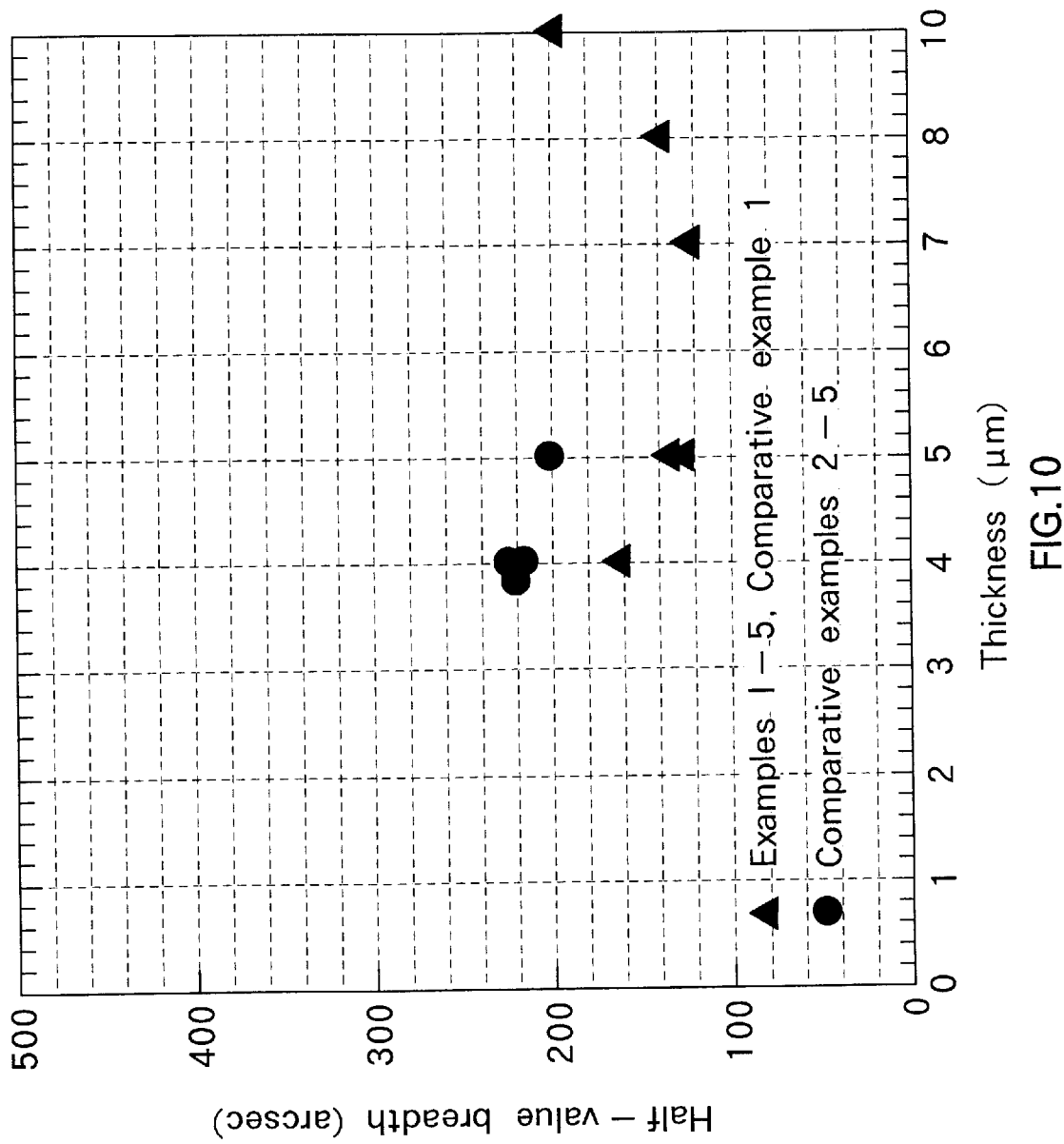
FIG. 10 is a view showing a relationship between a half-breadth value of a locking curb in an X-ray diffraction and a thickness of GaN layers of the semiconductor laser diode obtained by Examples 1–5 and Comparative examples 1–5 of the present invention.

The obtained GaN layers as described above in Examples 1–5 and Comparative examples 1–5 were analyzed with an X-ray diffraction method. FIG. 10 is a graph showing a half-value breadth of a locking curve with an X-ray analysis of the obtained GaN layers in Examples 1–5 and Comparative examples 1–5. The obtained results are also shown in Tables 1 and 2. In FIG. 9, a vertical axis shows a half-value breadth (unit; arcsec), and a horizontal axis shows a thickness of the GaN layer (unit; μm).

As can be seen in FIG. 10, Tables 1 and 2, a half-value breadth of Example 1 was a smallest value in those of Comparative examples 2–4. A half-value breadth of Example 2 was smaller than that of Comparative example 5. As a result of this, it was confirmed that GaN having a region grown in a lateral direction was excellent in crystallinity. Further, any half-value breadths of Examples 1–5 were smaller than that of Comparative example 1. This might be caused by the reason that if a thickness of the GaN layer was 10 μm, the bowing of the substrate increased, which caused an increase of deflection in crystals. As a result described above, in the GaN layer whose thickness was equal to or less than 8 μm and grown in a lateral direction partly, the bowing of the substrate was reduced and excellent crystallinity could be achieved.

Although the detailed describe is omitted here, in case that a semiconductor of a III-V group compound of a nitride system containing at least one kind element among a III group element and nitride excluding GaN, is grown, the same results can be obtained.

Example 2; Evaluation of the Semiconductor Laser Diode

Further, with the MOCVD method, a n-type clad layer, a n-type guide layer, an active layer, a p-type guide layer, a p-type clad layer and a p-side contact layer were formed onto the GaN layer of Example 2 sequentialy. Specifically, an n-type $Al_{0.08}Ga_{0.92}N$ mixed crystal doped silicon was grown 1.2 $\mu$m to form the n-type clad layer and n-type GaN doped silicon is grown 0.1 $\mu$m to form the n-type guide layer. The active layer was formed as described hereinafter. First, an N-type GaInN mixed crystal doped silicon is grown 7.0 nm to form the barrier layer, then, an undope-GaInN mixed crystal was grown 3.5 nm to form a well layer. Finally, the active layer was formed by stacking those layers in 3 periods. P-type GaN doped magnesium was grown 0.1 $\mu$m to form the p-type guide layer. A p-type $Al_{0.08}Ga_{0.92}N$ mixed crystal was grown in 0.5 $\mu$m to form the p-type clad layer. P-type GaN doped magnesium was grown 0.1 $\mu$m to form the p-side contact layer.

When forming each of layers with the MOCVD method, trimethylgallium was employed as a source gas of gallium, trimethylaluminum was employed as a source gas of aluminum, trimethylinduim was employed as a source gas of indium, and ammonia is employed as a source gas of nitride. Monosilane was employed as a source gas of silicon, and bis=cycropentadienyl magnesium was employed as a source gas of magnesium.

After forming the p-side contact layer, the p-side contact layer, the p-type clad layer, the p-type guide layer, the active layer, the n-type guide layer, the n-type clad layer and the n-side contact layer were selectively etched to expose the n-side contact layer on a surface. Following this, a mask was formed parallel to a longitudinal direction of a region where a p-side electrode to be formed in a latter process. With a RIE method by using the mask, a part of the p-side contact layer and the p-type clad layer were selectively etched to shape the upper part of the p-type clad layer and the p-side contact layer in a narrow belt shape.

An insulating layer made of silicon dioxide was formed on the whole exposed surface of the substrate with a deposition method. A resist film was formed thereon. Then, RIE was carried out in several times to cover regions except a surface of the p-side contact layer with the insulating film.

After this, on a surface and in a vicinity of the p-side contact layer, palladium, platinum and gold were deposited sequentially to form the p-side electrode. An opening was formed in a region on the n-side contact layer of the insulating layer and titanium, aluminum, platinum, and gold were deposited thereon to form the n-side electrode. After this, the substrate was ground in a manner to be 80 $\mu$m of thickness. Finally, the substrate was cleaved vertical to a longitudinal direction of the p-side electrode in a predetermined width, then, a reflective mirror film was formed onto the cleavage surface to produce the semiconductor laser diode. As for the above-mentioned Comparative example 5, the semiconductor laser diode was also produced as the same as Example 2.

Further, a submount and a heat sink were prepared. The semiconductor laser diodes of Example 2 and of Comparative example 5 were mounted on the heat sink through the submount to assemble a semiconductor laser-light emitting device, and then a life test was carried out at room temperature. Consequently, the semiconductor laser diode of Example 2 could achieve a life for over 1000 hours under 20 mW output. As compared with this, the semiconductor laser diode of Comparative example 5 obtained a life for over 100 hours under 20 mW. This could be achieved for the reason that the bowing of the submount was reduced, and accompanying by this, the bowing of each layers made of the semiconductor of the III-V group compound of the nitride system was reduced. Hence, this enhanced a contact among the submount, the heat sink and the semiconductor laser diode, which results in effectively dissipating heat generated by the semiconductor laser diode.

As has been described above, the present invention has been explained by given the embodiments and examples. The present invention is not limited by the embodiments and the examples, and many modifications and variations of the present invention are possible. For instance, in the above-mentioned each of embodiments, although the contact layer and the guide layer were made of GaN, the clad layer was made of AlGaN mixed crystal, and the active layer was made of InGaN mixed crystal, these semiconductor layers of the III-V group compound of the nitride system may be made of at least one kind element among a III group element and other semiconductors of a III-V group compound containing nitride. In the second embodiment, the underlying layer 61 made of undope-GaN and the covered growth layer 62 was given as an example, and in the third embodiment, the seed crystal layer 71 made of undope-GaN was given as an example, these layers also may be made of the semiconductor of the III-V group compound of the nitride system excluding undope-GaN.

Obviously many modifications and variations of the present invention are possible in the light of the above teachings. It is therefore to be understood that within the scope of the appended claims the invention may be practiced otherwise than as specifically described.

Furthermore, although in the above-mentioned each of embodiments, the substrate 11 was made of sapphire, the substrate may be made of materials whose thermal expansion coefficient is different from that of the semiconductor of the III-V group compound of the nitride system. Such materials are: silicon carbide (SiC) and spinel ($MgAl_2O_4$).

Figure 11:
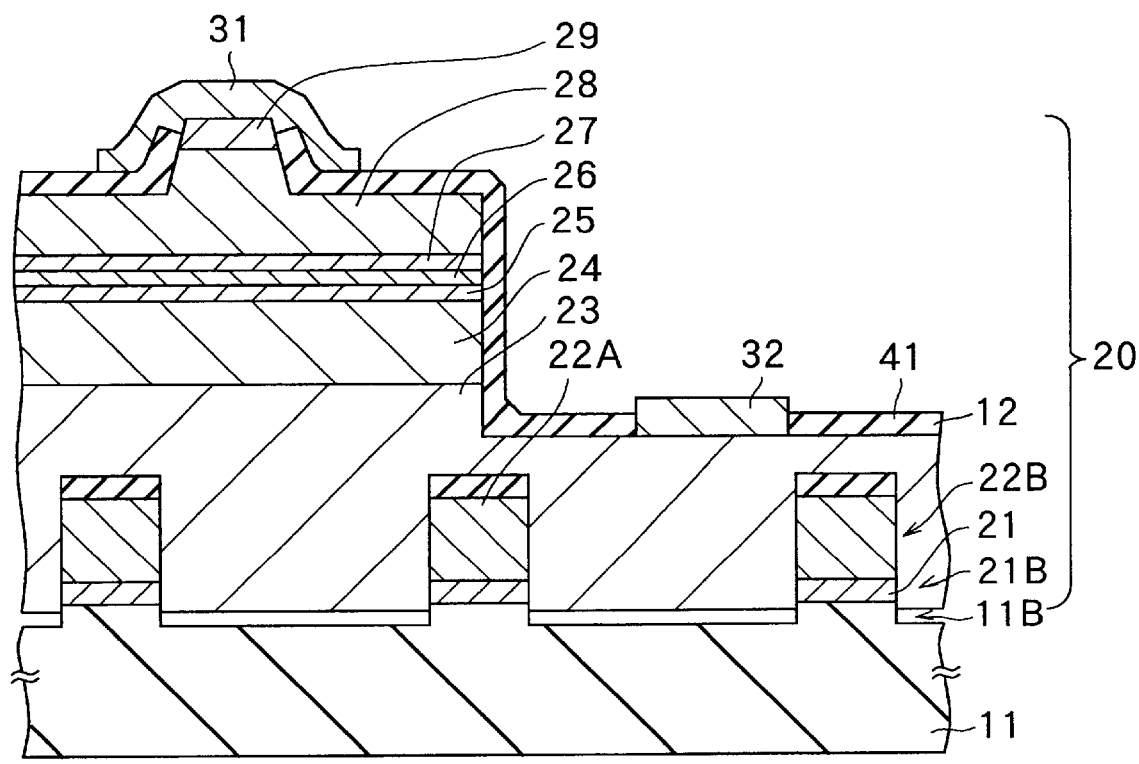
FIG. 11 is a section view showing a configuration of a main part of a semiconductor laser diode relative to other modifications of the semiconductor laser diode shown in FIG. 1.
Figure 12:
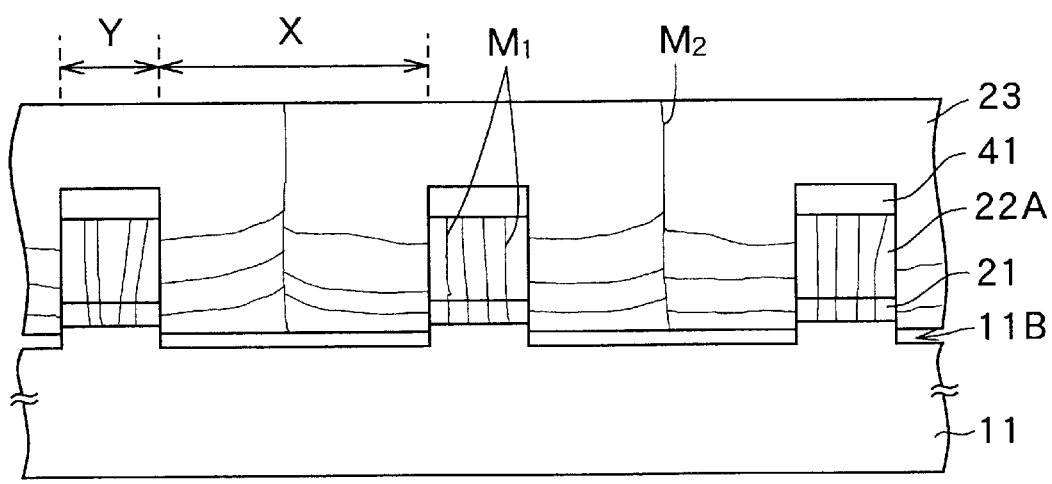
FIG. 12 is a diagram showing a part of the semiconductor laser diode shown in FIG. 11.

Moreover, in the above-mentioned first embodiment, after removing the insulating 41, the n-side contact layer 23 was formed. As shown in FIG. 11, the n-side contact layer 23 may be formed without removing the insulating layer 41 on the seed crystal layer 22. This shields the penetration dislocation $M_1$ with the insulating film 41, which prevents propagation of the penetration dislocation $M_1$ from the seed crystal layer 22. Accordingly, in the n-type contact layer 23, crystal defects hardly exist except the penetration dislocation $M_2$, which is a cause of a meet. This can gain the semiconductor layer of the III-V group compound of the nitride system with excellent crystallinity. However, preferably, a manufacturing method may be chosen depending on a purpose for use because when growing the n-side contact layer 23, a materials contained the insulating film 41 is mixed into the n-side contact layer 23 as an impurity, which degrades characteristics of a semiconductor laser diode.

In the above-mentioned each of embodiments, although it is described that the case where the semiconductor layer 20 and 60 were formed with the MOCVD method, other chemical vapor deposition methods such as a MBE method and a HVPE (hideride chemical vapor deposition) method can be used to form these layers. The HVPE method is a chemical vapor deposition method such that halogen contributes to transportation or reaction.

In the above-mentioned each of embodiments, although the n-side contact layer 23, the n-type clad layer 24, the n-type guide layer 25, the active layer 26, the p-type guide layer 27, the p-type clad layer 28 and the p-side contact layer 29 were sequentially stacked, a semiconductor laser diode having other configurations can be applied to the present invention. For example, a degradation-preventing layer may be included between the active layer 26 and the p-type guide layer 27 instead of the n-type guide layer 25 and the p-type guide layer 27. Further, in the above-mentioned each of embodiments, although a part of the p-type clad layer 28 and the p-side contact layer 29 were shaped in a narrow belt shape for electric current restriction, other configurations may be applied for electric current restriction. Additionally, although the semiconductor laser diode of a ridge waveguide type combined with a gain waveguide type and a reflective intensity waveguide type was described as an example, a semiconductor laser diode of a gain wave guide type and the semiconductor laser diode of a reflective intensity waveguide type can be also applied in a like manner.

In the above-mentioned first embodiment, although it is described that the case where the concave part 11B was provided in the substrate 11, the concave part 11B is not always needed to provide. However, if the concave part 11B is provided, occurrence of defects when producing and dislocation of a crystal axis can be prevented.

In addition, in the above-mentioned each of embodiments, although the semiconductor laser diode was given as a semiconductor device, the present invention can be applied to other semiconductor devices such as a light-emitting diode or an electric field effect transistor.

As has been mentioned above, in the semiconductor device according to the present invention, the lateral growth region is provided on the substrate and the semiconductor layer whose thickness is equal or less than 8 μm is disposed, so that even if the substrate and the semiconductor layer has different quality of materials, the bowing of the substrate can be restricted, and the semiconductor layer made of the semiconductor of the III-V group compound of the nitride can achieve high crystallinity.

While the invention has been described with reference to specific embodiment chosen for purpose of illustration, it should be apparent that numerous modifications could be made there to by those skilled in the art without departing from the basic concept and scope of the invention.

What is claimed is:

1. A semiconductor device including a semiconductor layer made of a semiconductor of a III-V group compound of a nitride system containing at least one element among a III group element and at least nitride among a V group element on one side of the substrate, comprising;

the semiconductor layer, which has partly a lateral growth region made by growing the semiconductor of the III-V group compound of the nitride system, and whose thickness is not greater than 8 micrometer wherein the thickness prevents bowing of the substrate.

2. The semiconductor device according to claim 1, further comprising a first crystal layer including a crystalline part made of a crystal of the semiconductor of a III-V group compound of the nitride system and a trench and a second crystal layer made of the semiconductor of the III-V group of the nitride system is disposed to cover the crystalline part of the first crystal layer.

3. A semiconductor device, comprising:
a substrate; and
a semiconductor nitride system made of a III-V group compound of a nitride system containing at least one element of a III group element and at least one nitride of a V group element, the semiconductor nitride system including a first crystalline layer having a seed crystal layer, the seed crystal layer having a first crystalline part with a first length L1, the seed crystal layer further having an opening part with a second length, the second length L2 being longer than the first length L1, the semiconductor nitride system further including a second crystalline layer having an n-side contact layer, the first crystalline layer and the second crystalline layer forming a thickness not greater than 8 micrometer wherein the thickness prevents bowing of the substrate.

4. The semiconductor device of claim 3, wherein the thickness of the semiconductor nitride system is not less than 4 micrometer and not greater than 8 m.

5. The semiconductor device of claim 3, wherein the first length L1 is not greater than 4 micrometer.

6. The semiconductor device of claim 3, wherein first length L1 is not less than 2 m and not greater than 4 micrometer.

7. The semiconductor device of claim 3, wherein first length L1 is 3 micrometer.

8. The semiconductor device of claim 3, wherein the second length L2 is not greater than 12 micrometer.

9. The semiconductor device of claim 3, wherein the second length is not less than 8 m and not greater than 12 micrometer.

10. The semiconductor device of claim 3, wherein the second length L2 is 9 m.

11. The semiconductor device of claim 3, wherein the opening part further includes a concave part.

12. The semiconductor device of claim 9, wherein the concave part is not less than 100 nm.

13. The semiconductor device of claim 3, wherein the n-side contact layer is not greater than 6 micrometer.

14. A semiconductor device made of a III-V group compound of a nitride system containing at least one element of a III group element and at least one nitride of a V group element formed on a substrate, comprising:

a first crystalline layer having a seed crystal layer, the seed crystal layer having a first crystalline part with a first length L1 not being greater than 4 micrometer, the seed crystal layer further having an opening part with a second length L2 not being greater than 12 micrometer, the first length L1 and the second length L2 being sized to limit contact area between the seed crystal layer and the substrate; and a second crystalline layer having an n-side contact layer, the n-side contact layer being not greater than 6 micrometer, the n-side contact layer being sized to stabilize thermal distribution of the substrate, wherein the first crystalline layer and the second crystalline layer form a thickness not greater than 8 micrometer wherein the thickness prevents bowing of the substrate.

15. The semiconductor device of claim 14, wherein the first length L1 is 3 micrometer.

16. The semiconductor device of claim 14, wherein the second length L2 is 9 micrometer.

17. A method of manufacturing a semiconductor device to prevent bowing of a substrate, comprising the steps of:
forming a seed crystal layer;
etching a crystalline part into the seed crystal layer, the crystalline part having a first length L1 not greater than 4 micrometer;
etching an opening part into the seed crystal layer, the opening part having a second length L2 not greater than 12 micrometer; and etching an n-side contact layer, the n-side contact layer being not greater than 6 m wherein the sizing of the first length L1, the second length L2 and the n-side contact layer prevents bowing of the substrate caused by differences in the thermal expansion coefficient between the substrate and the seed crystal layer.

18. The method according to claim 17, wherein the sizing of the first length L1, the second length L2 and the n-side contact layer prevents bowing of the substrate caused by differences in the lattice constant between the substrate and the seed crystal layer.

19. The method according to claim 17, further comprising etching a concave part in the opening part.

20. The methoc according to claim 17, further comprising limiting the thermal distribution of the substrate.

* * * * *